United States Patent
Carpenter et al.

(12)

(10) Patent No.: US 6,407,499 B1
(45) Date of Patent: Jun. 18, 2002

(54) METHOD OF REMOVING SURFACE PROTRUSIONS FROM THIN FILMS

(75) Inventors: Craig M. Carpenter; James J. Alwan, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/267,187

(22) Filed: Mar. 12, 1999

Related U.S. Application Data

(62) Division of application No. 08/726,955, filed on Oct. 7, 1996, now Pat. No. 5,902,491.

(51) Int. Cl.$^7$ .............................. H01J 1/62; H01J 63/04
(52) U.S. Cl. ........................ 313/495; 313/497; 313/309; 313/293; 445/24
(58) Field of Search ................................. 313/495, 496, 313/497, 309, 336, 293; 216/2; 445/24

(56) References Cited

U.S. PATENT DOCUMENTS

| | | |
|---|---|---|
| 4,940,916 A | 7/1990 | Borel et al. ................. 313/306 |
| 5,186,670 A | 2/1993 | Doan et al. .................... 445/24 |
| 5,210,472 A | 5/1993 | Casper et al. ................ 315/349 |
| 5,229,331 A | 7/1993 | Doan et al. .................... 437/228 |
| 5,252,881 A | 10/1993 | Muller et al. ................ 310/309 |
| 5,319,279 A * | 6/1994 | Watanabe et al. ........... 313/309 |
| 5,372,973 A | 12/1994 | Doan et al. ................. 437/228 |
| 5,445,107 A | 8/1995 | Roth et al. ..................... 117/8 |
| 5,620,350 A | 4/1997 | Takemura .................... 445/50 |
| 5,629,580 A | 5/1997 | Mandelman et al. ........ 313/310 |

OTHER PUBLICATIONS

Wolfe, et al. "Silicon Processing for the VLSI ERA"vol. 1: Process Technology, Lattice Press p. vii–xxiv, 1986.

* cited by examiner

Primary Examiner—Nimeshkumar D. Patel
Assistant Examiner—Mariceli Santiago
(74) Attorney, Agent, or Firm—Dorsey & Whitney LLP

(57) ABSTRACT

A method for removing a surface protrusion projecting from a layer of a first material deposited on a surface of a substrate. In accordance with one embodiment of the invention, a layer of a second material is applied on the layer of first material. A sufficient quantity of the second material is removed to expose the surface protrusion. The first material exposed through the surface protrusion is then removed.

18 Claims, 2 Drawing Sheets

METHOD OF REMOVING SURFACE PROTRUSIONS FROM THIN FILMS

CROSS-REFERENCE TO RELATED APPLICATION

This application is a divisional of U.S. patent application Ser. No. 08/726,955, filed Oct. 7, 1996, now U.S. Pat. No. 5,902,491. +gi

STATEMENT OF GOVERNMENT INTEREST

This invention was made with Government support under Contract No. DABT63-93-C-0025 ordered by Advanced Research Projects Agency (ARPA). The Government has certain rights in this invention.

TECHNICAL FIELD

The present invention is directed generally to the formation of a layer on a substrate and specifically to removing surface protrusions from such a layer which inherently occur during its formation.

BACKGROUND OF THE INVENTION

Processes for depositing a thin film layer on a substrate are known in the art. An example of one such process is physical vapor deposition (PVD). Inherent in the PVD process is the formation of surface protrusions on the thin film during deposition of the material forming the thin film. These surface protrusions can be many times the size of components to be later deposited on the thin film. As a result, the surface protrusions may project into layers of material formed on the thin film layer. In such cases, the surface protrusions may result in an unwanted short circuit between the thin film layer and a layer formed on top of the thin film layer. For example, in the baseplate of a field emission display (FED), such surface protrusions could result in a short circuit between the thin film layer on which emitters are formed and an extraction grid positioned above the emitters. This is true because a surface protrusion can have a height which is much greater than the height of an insulating layer positioned between the thin film layer and the extraction grid.

Various techniques have been attempted in the prior art in an effort to alleviate the adverse effects of surface protrusions. First, the parameters of the PVD process have been adjusted to try and prevent formation of the surface protrusions. This technique has not been entirely successful in that some surface protrusions are inherently formed during the PVD process. Given that some surface protrusions are formed, chemical-mechanical planarization (CMP) has been utilized to try and remove these protrusions from the thin film layer. When CMP is used directly on the thin film layer, however, the larger surface protrusions sometimes break lose and scratch the surface of the thin film layer. These scratches can result in unacceptably large areas of the thin film being unsuitable for the formation of the desired components.

In view of the problems associated with these processes for removing surface protrusions from a thin film, it is desirable to develop a process which removes the surface protrusions from the thin film without detrimentally affecting the surface of the thin film layer.

SUMMARY OF THE INVENTION

The present invention is a method for removing a surface protrusion projecting from a layer of a first material deposited on a surface of a substrate. In one embodiment, the method comprises the steps of applying a layer of a second material on the layer of first material. A sufficient quantity of the second material is removed to expose the protrusion. The first material exposed through the protrusion is then removed.

The step of removing a sufficient quantity of the second material to expose the protrusion can comprise mechanical planarization of the second material, chemical mechanical planarization of the second material, or can comprise the steps of removing the second material above a predetermined distance from the surface of the substrate so that the thickness of the second material above the first material is greater adjacent the protrusion than above the protrusion and isotropically removing the second material to expose the protrusion.

In accordance with another embodiment of the present invention, a field emission display (FED) is constructed from a process comprising the following steps. First, a thin film layer is deposited on a substrate. The thin film layer may have one or more surface protrusions. The thin film layer is covered with a sacrificial layer having a top surface. Through a leveling material removal process, such as chemical-mechanical planarization, a portion of the top surface of the sacrificial layer is removed until the sacrificial layer has a predetermined thickness D to thereby expose on the top surface all surface protrusions having a height of at least D. The exposed surface protrusions are then etched to remove the surface protrusions from the thin film layer. The sacrificial layer is etched to remove the sacrificial layer from the thin film layer. Emitters are then constructed on the thin film layer, and an extraction grid is formed above the emitters. Finally, a screen is constructed above the extraction grid, the screen having a phosphor-coated surface facing the extraction grid.

DETAILED DESCRIPTION OF THE INVENTION

Figure 1:
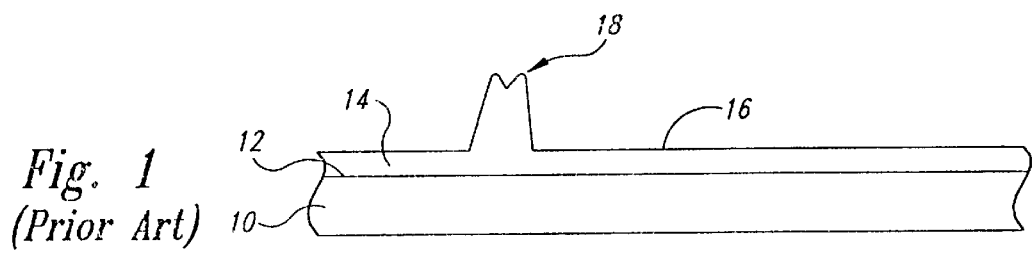
FIG. 1 is a cross-sectional view of a substrate with a thin film layer having surface protrusions deposited on the substrate.

FIG. 1 illustrates a substrate 10 having a top surface 12. The substrate 10 may be glass or other materials known in the art which are suitable for use as a substrate. A thin film layer 14 is deposited on the top surface 12 of the substrate 10. The thin film layer 14 may be a conductive layer on which are formed elements of a device, such as a field emission display baseplate. In one embodiment, the thin film layer 14 is chromium. Other suitably conductive materials can also be used. The depositing of the thin film layer 14 may be done using any of a number of processes known in the art, such as physical vapor deposition (PVD). Inherent in many of these processes is the unwanted formation of surface protrusions 18 on the top surface 16 of the thin film layer 14. Only one surface protrusion 18 is shown in FIG. 1, but in reality such protrusions may be scattered randomly over the entire surface 16 of the thin film layer 14.

Figure 2:
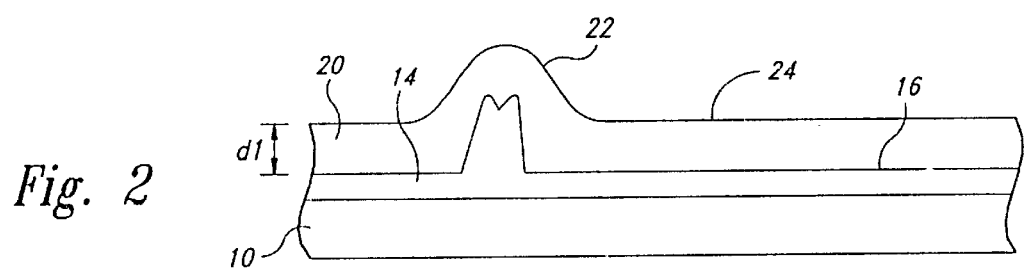
FIG. 2 is a cross-sectional view of the substrate and thin film layer of FIG. 1 showing a sacrificial layer deposited on the thin film layer.

FIG. 2 shows the first step of the process of the preferred embodiment of the present invention in which a sacrificial layer 20 is deposited on the top surface 16 of the thin film layer 14. The sacrificial layer 20 typically consists of a material which is selectively removable from the thin film layer 14. In one embodiment of the present invention, the sacrificial layer 20 consists of silicon dioxide. The sacrificial layer 20 shown in FIG. 2 is deposited as a conformal layer on the thin film layer 14. The sacrificial layer 20 need not, however, be a conformal layer. If the sacrificial layer 20 is not a conformal layer, the surface protrusion 18 may extend above the top surface of the sacrificial layer (see FIG. 3). The sacrificial layer 20 may be deposited so that it has a predetermined thickness d1 above the top surface 16 of the thin film layer 14.

Figure 3:
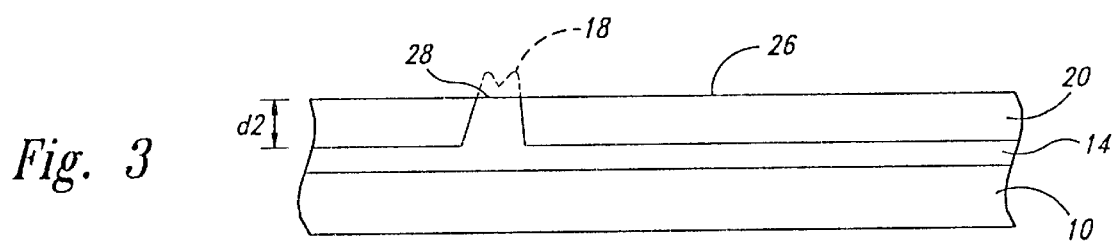
FIG. 3 is a cross-sectional view showing the sacrificial layer after it had been planarized to remove the tips of the surface protrusions.

A bump 22 is formed on the top surface 24 of the sacrificial layer 20 wherever there is a surface protrusion 18 on the thin film layer 14. These bumps 22 are removed from the surface 24 by mechanical planarization or chemical-mechanical planarization (CMP). Although CMP is discussed as the preferred method used to remove the bump 22, one skilled in the art will realize that other known processes can also be utilized. The CMP process is performed until a sufficient amount of the sacrificial layer 20 has been removed to expose the tip of the surface protrusion 18. FIG. 3 shows the sacrificial layer 20 having a planarized surface 26 after the CMP process is complete. The tip of the surface protrusion 18—illustrated by the dotted line—is removed by the CMP process. The removal of the tip of the surface protrusion 18 results in an island 28 of the material comprising the thin film layer 14 being exposed on the planarized surface 26. Such islands 28 occur wherever there was a surface protrusion 18 on the thin film layer 14 having a height greater than d2.

Figure 4:
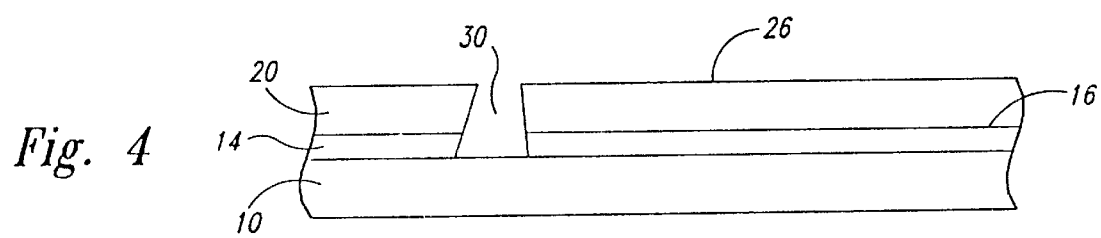
FIG. 4 is a cross-sectional view of the substrate of FIGS. 1–3 showing the removal of the surface protrusions from the thin film layer.

The next step of the present process is the removal of the surface protrusions 18 as shown in FIG. 4. The surface protrusions 18 are removed from the thin film layer 14 through a process, such as etching, which is known in the art. An etchant is disposed on the planarized surface 26. The etchant is preferably chosen so that it will selectively remove the material of the protrusions 18 exposed through the island 28 to a greater degree than the material of the sacrificial layer 20. In this way, the sacrificial layer 20 protects the portions of the thin film layer 14 not having surface protrusions 18 while allowing removal of the surface protrusions. The etching process results in a void 30, which is the space formerly occupied by the surface protrusion 18.

Figure 5:
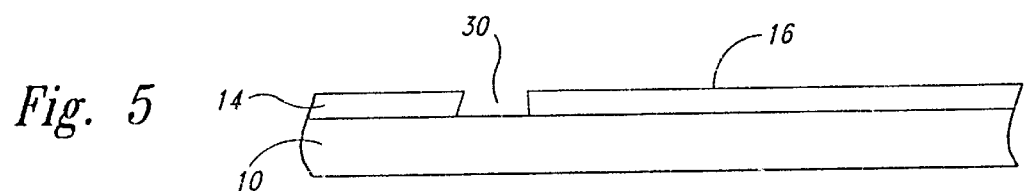
FIG. 5 is a cross-sectional view of the substrate and thin film layer of FIGS. 1–4 depicting the thin film layer after its surface protrusions have been removed in accordance with the preferred embodiment of the present invention.

In FIG. 5, the sacrificial layer 20 is removed from the top surface 16 of the thin film 14. This removal of the sacrificial layer 20 may be accomplished using known etching processes. In the etching process, an etchant is preferably used which selectively removes the material of the sacrificial layer 20 to a greater degree than the material of the thin film layer 14. A CMP process could alternatively be used to remove the sacrificial layer 20. The CMP process will not harm the top surface 16 of the thin film layer 14 since the large surface protrusions 18 (i.e., having a height of at least d2) have been removed from the thin film layer. Although the sacrificial layer 20 is depicted and described as being removed from the thin film layer 14, the sacrificial layer need not always be removed. For example, if the sacrificial layer 20 is an insulating layer which is part of the device being fabricated, the sacrificial layer could remain and further layers deposited on the top surface 26 of the sacrificial layer.

It should be noted that after the process of the present invention has been performed on the thin film layer 14, the thin film layer has a void 30 in the same location where a surface protrusion 18 was previously located. Such voids 30, however, generally do not adversely affect the utility of the thin film layer 14. These voids 30 occupy a small percentage of the total surface area of the thin film layer 14, which means the remaining area can be utilized for the formation of the desired elements on the thin film layer. Furthermore, the voids 30 do not pose the threat of short circuiting, as did the surface protrusions 18, to layers disposed above the surface 16 of the thin film layer 14.

Figure 6:
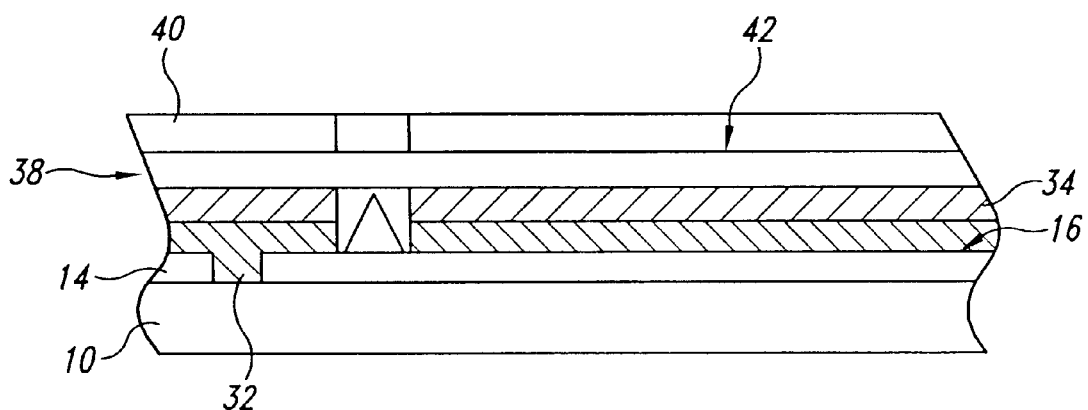
FIG. 6 illustrates a FED formed according to the methods of the invention.

An FED device formed by the methods provided herein is illustrated in FIG. 6. After removal of the protrusion 18 and formation of the void 30 in the thin film layer 14, an emitter 32 is constructed on the upper surface 16 of the thin film layer 14. An insulating material 34 is formed atop the film layer 14 and fills the voids 30 therein. AD extraction grid 36 is formed on the insulating material 34 above the emitter 32. Finally, a transparent screen 38 is constructed above the extraction grid 36, the transparent screen 38 having an anode 40 and a cathodoluminescent coating 42 facing the extraction grid 36.

The present invention has particular utility in the area of processing field emission displays and flat panel displays. In addition, the process is well suited for application to large area substrates in the range of twelve inches.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A field emission display (FED) constructed from a process comprising:

depositing a conductive thin film layer on a substrate in which the thin film layer has at least one surface protrusion;

covering the thin film layer with an insulating sacrificial layer having a top surface;

using chemical-mechanical planarization to remove a portion of the sacrificial layer from the top surface until the sacrificial layer has a thickness D to thereby expose on the top surface all surface protrusions having a height of at least D;

etching the surface protrusions from the thin film layer through the exposed portions of any such protrusions to form void spaces at the location of the surface protrusions, the void spaces being present within the thin film layer and the sacrificial layer;

etching the sacrificial layer to remove the sacrificial layer from the thin film layer to expose an upper surface of the thin film layer having void spaces distributed therein;

constructing emitters on an upper surface of the thin film layer;

forming a layer of insulating material above the thin film layer;

forming an extraction grid on the layer of insulating material above the emitters; and constructing a transparent screen above the extraction grid, the screen having an anode and a cathodoluminescent coating on the anode facing the extraction grid.

2. The field emission display of claim 1 wherein etching the surface protrusions from the thin film layer through the exposed portions of any such protrusions comprises applying an etchant to each protrusion that selectively removes the material of the thin film layer to a greater degree than the material of the sacrificial layer.

3. The field emission display of claim 1 wherein covering the thin film layer comprises applying the insulating sacrificial layer having a thickness making top surface of the thin film layer less than the height of any surface protrusion.

4. The field emission display of claim 1 wherein covering the thin film layer with an insulating sacrificial layer comprises conformally covering the thin film layer with the sacrificial layer.

5. The field emission display of claim 1 wherein depositing a conductive thin film layer comprises physical vapor deposition.

6. The field emission display of claim 1 wherein etching the sacrificial layer to remove the sacrificial layer comprises isotropically etching the sacrificial layer.

7. A field emission display (FED) constructed from a process comprising:

depositing a conductive layer on a substrate in which the conductive layer has at least one surface protrusion;

covering the conductive layer with a sacrificial layer having a top surface;

removing a portion of the sacrificial layer from the top surface to expose at least some of any surface protrusion in the conductive layer, removing any such exposed surface protrusions from the conductive layer through the exposed portions of the protrusions to form void spaces at the location of the surface protrusions, the void spaces being present within the conductive layer and the sacrificial layer;

removing the sacrificial layer from the conductive layer to expose the conductive layer having void spaces distributed therein;

constructing emitters on an upper surface of the conductive layer;

forming a layer of insulating material above the conductive layer;

forming an extraction grid on the layer of insulating material above the emitters; and constructing a transparent screen above the extraction grid, the screen having an anode and a cathodoluminescent coating on the anode facing the extraction grid.

8. The field emission display of claim 7 wherein depositing a conductive layer on a substrate in which the conductive layer may have at least one surface protrusion comprises physical vapor deposition.

9. The field emission display of claim 7 wherein the conductive layer comprises chromium.

10. The field emission display of claim 7 wherein covering the conductive layer with a sacrificial layer having a top surface comprises forming a layer of silicon dioxide on the conductive layer.

11. The field emission display of claim 7 wherein removing a portion of the sacrificial layer from the top surface to expose at least some of any surface protrusions in the conductive layer comprises chemical mechanical planarization of the sacrificial layer.

12. The field emission display of claim 7 wherein removing any such exposed surface protrusions from the conductive layer through the exposed portions of the protrusions comprises etching the conductive layer.

13. The field emission display of claim 7 wherein removing the sacrificial layer from the conductive layer comprises mechanical planarization of the sacrificial layer.

14. A field emission display (FED) formed from a process comprising the steps of:

forming a conductive layer on a substrate, the conductive layer having at least one surface protrusion;

covering the conductive layer with a sacrificial layer having a top surface;

plagiarizing the top surface of the sacrificial layer until the sacrificial layer has a predetermined thickness of D to thereby expose on the top surface all surface protrusions having a height of at least D;

removing portions of the conductive layer through any such exposed portions of the conductive layer to remove all surface protrusions having the height of at least D and forming void spaces at the location of the surface protrusions, the void spaces being present within the conductive layer and the sacrificial layer;

removing the sacrificial layer from the conductive layer to expose the conductive layer having void spaces distributed therein;

constructing emitters on an upper surface of the conductive layer;

forming a layer of insulating material above the conductive layer;

forming an extraction grid on the layer of insulating material above the emitters; and constructing a transparent screen above the extraction grid, the screen having an anode and a cathodoluminescent coating on the anode facing the extraction grid.

15. The field emission display of claim 14 wherein the sacrificial layer comprises silicon dioxide.

16. The field emission display of claim 14 wherein the step of planarizing the top surface of the sacrificial layer comprises the step of chemical-mechanical planarization (CMP) of the sacrificial layer.

17. The field emission display of claim 14 wherein removing portions of the conductive layer comprises the step of performing an etch to selectively remove the surface protrusions while leaving the sacrificial layer in tact.

18. The field emission display of claim 14 wherein the step of removing the sacrificial layer from the conductive layer comprises the step of chemical-mechanical planarization (CMP) to remove the sacrificial layer.

* * * * *

UNITED STATES PATENT AND TRADEMARK OFFICE
CERTIFICATE OF CORRECTION

PATENT NO. : 6,407,499 B1
DATED : June 18, 2002
INVENTOR(S) : Craig M. Carpenter and James J. Alwan It is certified that error appears in the above-identified patent and that said Letters Patent is hereby corrected as shown below:

<u>Title page,</u>
Item [56], References Cited, U.S. PATENT DOCUMENTS, please add the following reference:
-- 5,259,799   11/1994   Doan et al.   445/24 --

<u>Column 4,</u>
Line 25, reads "AD" should read -- An --

Signed and Sealed this

Seventh Day of January, 2003

JAMES E. ROGAN
*Director of the United States Patent and Trademark Office*